US012806965B2

(12) United States Patent
Shim et al.

(10) Patent No.: US 12,806,965 B2
(45) Date of Patent: Nov. 24, 2026

(54) HIGH-VOLTAGE HEATER INCLUDING DISCONNECTION DETECTION UNIT AND DISCONNECTION DETECTION METHOD USING SAME

(71) Applicant: Hanon Systems, Daejeon (KR)

(72) Inventors: Sungun Shim, Daejeon (KR); Seung Hwan Shin, Daejeon (KR)

(73) Assignee: HANON SYSTEMS, Daejeon (KR)

( * ) Notice: Subject to any disclaimer, the term of this patent is extended or adjusted under 35 U.S.C. 154(b) by 672 days.

(21) Appl. No.: 18/036,551

(22) PCT Filed: Sep. 30, 2021

(86) PCT No.: PCT/KR2021/013438
§ 371 (c)(1),
(2) Date: May 11, 2023

(87) PCT Pub. No.: WO2022/145639
PCT Pub. Date: Jul. 7, 2022

(65) Prior Publication Data

US 2023/0406068 A1 Dec. 21, 2023

(30) Foreign Application Priority Data

Dec. 29, 2020 (KR) ........................ 10-2020-0186116

(51) Int. Cl.
*B60H 1/00* (2006.01)
*B60H 1/22* (2006.01)
*G01R 19/165* (2006.01)

(52) U.S. Cl.
CPC ....... *B60H 1/00978* (2013.01); *B60H 1/2218* (2013.01); *B60H 1/2225* (2013.01); *G01R 19/1659* (2013.01)

(58) Field of Classification Search
CPC B60H 1/00978; B60H 1/2218; B60H 1/2225; G01R 19/1659; G01R 31/52; G01R 31/58; H05B 3/56; H05B 2203/02
USPC .......................................................... 219/482
See application file for complete search history.

(56) References Cited

U.S. PATENT DOCUMENTS 5,420,397 A 5/1995 Weiss et al.

FOREIGN PATENT DOCUMENTS

| | | | | | |
|---|---|---|---|---|---|
| JP | 2008286164 A | * | 11/2008 | ............ | F02P 19/027 |
| JP | 2008286166 A | | 11/2008 | | |
| KR | 10-0894008 B1 | | 4/2009 | | |
| KR | 10-1398480 B1 | | 5/2014 | | |
| KR | 101422676 B1 | * | 7/2014 | .............. | H05B 3/20 |

* cited by examiner

*Primary Examiner* — Elizabeth M Kerr
*Assistant Examiner* — Simpson A Chen
(74) *Attorney, Agent, or Firm* — NORTON ROSE FULBRIGHT US LLP

(57) ABSTRACT

The present invention relates to a high-voltage heater that generates heat by using a heating effect of an electric current, and more particularly, to a high-voltage heater including a disconnection detection unit, which is capable of detecting disconnection of a heating unit by checking a voltage between the heating unit and a switching unit when a high voltage is applied even in a state in which a heater does not operate, and a disconnection detection method using the same.

11 Claims, 5 Drawing Sheets

HIGH-VOLTAGE HEATER INCLUDING DISCONNECTION DETECTION UNIT AND DISCONNECTION DETECTION METHOD USING SAME

CROSS REFERENCE TO RELATED APPLICATIONS

This application is a national phase under 35 U.S.C. § 371 of International Application No. PCT/KR2021/013438 filed on Sep. 30, 2021, which claims the benefit of priority from Korean Patent Application No. 10-2020-0186116 filed on Dec. 29, 2020. The entire contents of these applications are incorporated herein by reference in their entirety.

TECHNICAL FIELD

The present invention relates to a high-voltage heater that generates heat by using a heating effect of an electric current, and more particularly, to a high-voltage heater including a disconnection detection unit, which is capable of detecting disconnection of a heating unit by checking a voltage between the heating unit and a switching unit when a high voltage is applied even in a state in which a heater does not operate, and a disconnection detection method using the same.

BACKGROUND ART

A heating system for a vehicle in the related art heats a vehicle interior by allowing a heat exchange medium (engine coolant) to flow through a flow path and increasing a temperature of air by allowing air supplied into the vehicle interior to exchange heat with heat of the engine coolant through a heat exchanger when the engine coolant passes through the heat exchanger (heater core).

However, in the case of a vehicle using a diesel engine, a predetermined time is required to heat the engine after the engine starts. For this reason, because a temperature of a coolant is also raised, the amount of time for which the coolant reaches a normal temperature increases, which causes a problem in that heating performance deteriorates for a predetermined time after the engine starts. In addition, in the case of an electric vehicle that is driven only by a motor, the amount of heat generation of a coolant for cooling the motor is remarkably smaller than that of an internal combustion engine vehicle or a hybrid vehicle that uses a combustion engine. Therefore, there is a need to develop a technology to improve heating performance of the electric vehicle.

Therefore, there has been developed a technology for improving heating performance of the vehicle by installing a positive temperature coefficient (PTC) heater, which includes a heating unit that generates heat by means of electricity, at a rear side of a heat exchanger (heater core). The PTC heater for a vehicle heats the vehicle interior by using electric power of a battery and controls a temperature of a heating unit by modulating a voltage applied to the PTC heater by using pulse width modulation (PWM).

FIG. 1 is a circuit diagram illustrating a schematic configuration of a PWM control type PTC heater device 10 in the related art. As illustrated, the PTC heater device 10 includes: a control unit 11 configured to control cooling, heating, and air blowing in a vehicle; a microcomputer 12 configured to control a switching unit 13 configured to supply electric power to heating units 17 in response to a heating control instruction of the control unit 11; the switching unit 13 configured to supply the electric power to the PTC heater 17 by being switched in response to a switching control instruction of the microcomputer 12; and the heating units 17 configured to generate heat at a positive temperature by using electric power supplied by the switching of the switching unit 13.

Meanwhile, the plurality of heating units 17 of the PTC heater device 10 configured as described above is connected in parallel and generates heat. In case that any one or more of the plurality of heating units 17 is disconnected, a problem occurs in that heating performance deteriorates. Therefore, there has been publicly known a technology related to the PTC heater device 10 in the related art, and the technology detects a magnitude of an electric current flowing through the switching unit 13 to check whether the heating unit 17 is disconnected, and determines the disconnection when the detected magnitude deviates from a normal electric current range.

However, the technology for detecting the disconnection of the heating unit 17 of the PTC heater device 10 in the related art may perform the detection only when the PTC heater device 10 operates. For this reason, there is a problem in that the disconnection of the heating unit cannot be detected in case that the PTC heater device 10 does not operate or the electric power is not supplied to the heating unit 17 by the switching of the switching unit 13.

DISCLOSURE

Technical Problem

The present invention has been made in an effort to solve the above-mentioned problems, and an object of the present invention is to provide a high-voltage heater including a disconnection detection unit, which is capable of checking whether a heating unit is disconnected by checking a voltage at a rear end of the heating unit when a high voltage is applied even in a case in which electric power is not supplied to the heating unit, and a disconnection detection method using the same.

Another object of the present invention is to provide a high-voltage heater including a disconnection detection unit, which restricts an operation of a high-voltage heater in case of disconnection of a heating unit by stopping a PWM output in case that the disconnection of the heating unit is detected, and a disconnection detection method using the same.

Technical Solution

A high-voltage heater including a disconnection detection unit according to an embodiment of the present invention includes: a high-voltage line having one end connected to a high-voltage supply unit, and the other end connected to ground; a control unit configured to control a switching unit in response to a control signal of an input unit; the switching unit provided on the high-voltage line and configured to supply electric power to a heating unit by being switched in response to a switching signal of the control unit; the heating unit provided between the switching unit and the high-voltage supply unit on the high-voltage line and configured to generate heat under the control of the switching unit; and the disconnection detection unit configured to detect a voltage between the switching unit and the heating unit on the high-voltage line and transmit the voltage to the control unit, in which the control unit determines that the heating unit is disconnected when the voltage detected by the disconnection detection unit is lower than a reference voltage when a high voltage is applied to the high-voltage line.

In addition, the disconnection detection device may include a high-voltage detection unit provided on the high-voltage line and configured to provide the control unit with a signal indicating whether the high voltage is applied to the high-voltage line, and the control unit may determine whether the heating unit is disconnected only when the high-voltage detection unit receives a signal indicating that the high voltage is applied.

In addition, the control unit may transmit the switching signal to the switching unit through a pulse width modulation signal, and the control unit may determine whether the heating unit is disconnected when the pulse width modulation signal is not applied or the pulse width modulation signal is low.

In addition, the control unit may determine whether the heating unit is disconnected only when the switching unit is turned off.

In addition, the disconnection detection unit may be provided in the form of a plurality of resistors connected in series, the disconnection detection unit may have one end connected between the switching unit and the heating unit on the high-voltage line, and the other end connected to ground, and the disconnection detection unit may transmit a voltage between an nth resistor and an (n−1)th resistor from one end to the control unit.

In addition, the disconnection detection unit may include a DC voltage sensor, the DC voltage sensor may detect a high voltage applied between the switching unit and the heating unit on the high-voltage line, and the disconnection detection unit may provide the control unit with a signal indicating whether the high voltage is detected.

In addition, the switching unit may be provided as a plurality of switching units connected in series, and the control unit may determine whether the heating unit is disconnected only when at least one of the switching units is turned off.

In addition, the high-voltage heater may further include: an electric current sensing resistor provided between the ground and the switching unit on the high-voltage line; and an electric current sensing unit configured to provide the control unit with an electric current between the electric current sensing resistor and the switching unit on the high-voltage line, and the control unit may determine that the heating unit is disconnected in case that the electric current detected by the electric current sensing unit is lower than a reference current when the pulse width signal is high.

A disconnection detection method of a high-voltage heater according to another embodiment of the present invention includes: determining, by the control unit, whether a high voltage is applied to the high-voltage line; determining, by the control unit, whether a pulse width modulation signal is applied when the high voltage is applied; comparing a detected voltage detected by the disconnection detection unit with a reference voltage detected by the disconnection detection unit when the heating unit is normal when the pulse width modulation signal is not applied; and determining, by the control unit, that the heating unit is disconnected when the detected voltage is lower than the reference voltage.

In addition, the disconnection detection method may include: detecting, by the control unit, whether a pulse width transmitted to the switching unit is high or low when the pulse width modulation signal is applied, in which the control unit determines whether the heating unit is disconnected when the pulse width is low.

In addition, the disconnection detection method may further include: detecting, by the control unit, an electric current generated between the switching unit and the ground when the pulse width is high; comparing the detected electric current with a reference current detected by the control unit when the heating unit is normal; and determining, by the control unit, that the heating unit is disconnected when the detected electric current is lower than the reference current value.

In addition, the switching unit may be provided as a plurality of switching units connected in series, and the disconnection detection method may include: detecting, by the control unit, an on/off state of the switching unit; and determining, by the control unit, whether the heating unit is disconnected only when at least one of the switching unit is turned off.

Advantageous Effects

The high-voltage heater including the disconnection detection unit and the disconnection detection method using the same of the present invention configured as described above may detect whether the heating unit is disconnected even before or after the high-voltage heater operates.

In addition, in case that the disconnection of the heating unit is detected, the operation of the high-voltage heater may be restricted, which makes it possible to prevent burnout of the heating unit or damage to the circuit that may occur when the high-voltage heater operates in the state in which the heating unit is disconnected.

In addition, the disconnection detection unit may be implemented by using an inexpensive chip resistor, which makes it possible to reduce costs require the apply the disconnection detection unit to the high-voltage heater in the related art.

Further, the disconnection detection unit of the present application physically detects and determines whether the heating element is disconnected, which makes it possible to improve detection accuracy in comparison with the related art that detects disconnection by using a software logic.

DESCRIPTION OF REFERENCE NUMERALS

Figure 1:
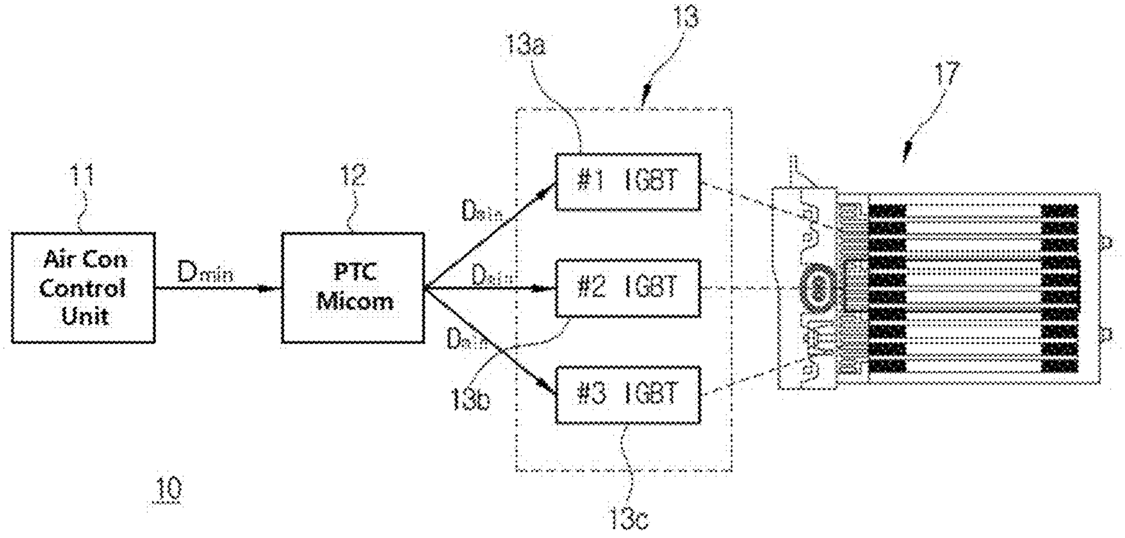
FIG. 1 is a circuit diagram illustrating a schematic configuration of a PWM control type PTC heater device in the related art.

1000, 2000: High-voltage heater
110: High-voltage supply unit
120: Input unit
130: High-voltage detection unit
200: Control unit 250: Gate driver
300: Switching unit
310: First switching unit
320: Second switching unit
500: Heating unit
600: Disconnection detection unit
610: Detection circuit
700: Electric current detection unit
710: Electric current detection resistor
720: Amplifier
L1: High-voltage line
L2: Signal line
L3: Control line
L4: Detection line
L4-1: First detection line
L4-2: Second detection line
L5: Electric current detection line
G1, G2: Ground

MODE FOR INVENTION

Hereinafter, the embodiments of the present invention will be described in detail with reference to the drawings.

Figure 2:
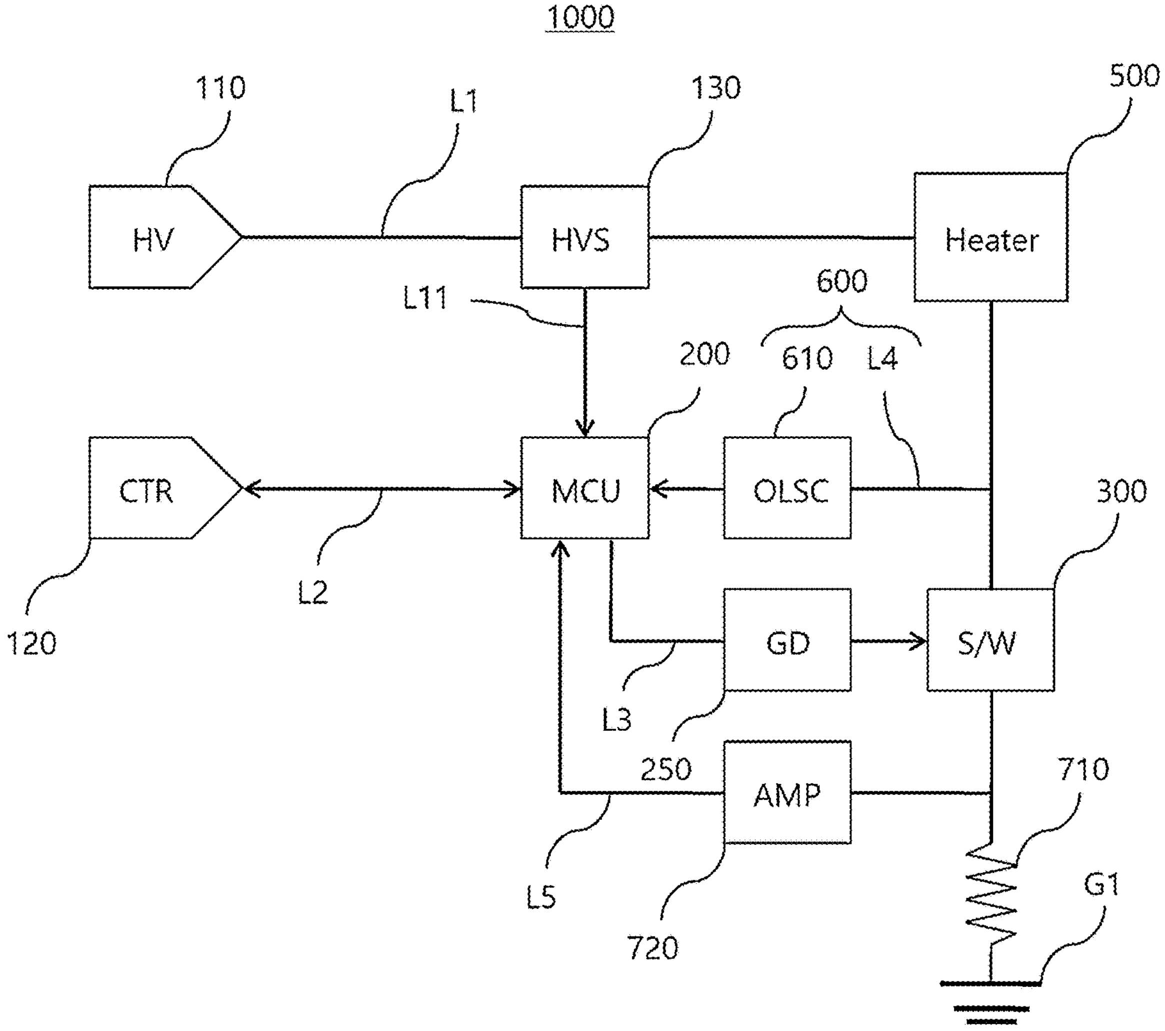
FIG. 2 is a circuit diagram illustrating a schematic configuration of a disconnection detection device of a high-voltage heater according to a first embodiment of the present invention.

FIG. 2 is a circuit diagram illustrating a schematic configuration of a high-voltage heater 1000 including a disconnection detection unit according to a first embodiment of the present invention.

As illustrated, the high-voltage heater 1000 includes: a high-voltage line L1 having one end connected to a high-voltage supply unit 110, and the other end connected to the ground G1; a control unit 200 configured to control a switching unit 300 in response to a control signal of an input unit 120; the switching unit 300 provided on the high-voltage line L1 and configured to supply electric power to a heating unit 500 by being switched in response to a switching signal of the control unit 200; and the heating unit 500 provided between the switching unit 300 and the high-voltage supply unit 110 on the high-voltage line L1 and configured to generate heat under the control of the switching unit 300.

The high-voltage supply unit 110 is configured to supply a high voltage to the high-voltage line L1 when a vehicle starts. For example, the high-voltage supply unit 110 may be a battery for a vehicle.

The input unit 120 may be an air conditioning device controller configured to control an air conditioning device by an operation of a vehicle occupant.

The control unit 200 is configured to control a heating temperature of the heating unit 500 by receiving an air conditioning device control signal inputted from the input unit 120 through a signal line L2 and transmitting a pulse width modulation (PWM) signal to the switching unit 300 through a control line L3. The control unit 200 may be a typical micro controller unit (MCU) for a vehicle.

The switching unit 300 is provided on the high-voltage line L1. When the switching unit 300 is turned on by being switched by the pulse width modulation signal transmitted from the control unit 200 through the control line L3, the switching unit 300 supplies electric power to the heating unit 500. When the switching unit 300 is turned off, the switching unit 300 cuts off the supply of electric power to the heating unit 500. As an example of a typical switching element, an insulated gate bipolar transistor (IGBT), a metal-oxide semiconductor field effect transistor (MOSFET), a silicon carbide transistor (SiC transistor), or the like may be applied as the switching unit 300. In addition, a gate driver 250 is provided on the control line L3 to amplify the pulse width modulation signal of the control unit 200.

The heating unit 500 is provided on the high-voltage line L1. The heating unit 500 may be an electrothermal wire or an electrothermal film that generates heat by means of electric power supplied through the switching unit 300.

A high-voltage detection unit 130 is provided on the high-voltage line L1 and configured to provide the control unit 200, through a high-voltage signal line L11, with information on whether a high voltage is applied to the high-voltage line L1.

In the high-voltage heater 1000 configured as described above, when the heater driving signal of the input unit 120 is transmitted to the control unit 200 through the signal line L2 by the operation of the occupant in the state in which the high voltage is applied to the high-voltage line L1 when the vehicle starts, the control unit 200 transmits the pulse width modulation signal to the switching unit 300 through the control line L3. In case that the pulse width is high, the switching unit 300 is turned on and supplies electric power to the heating unit 500 through the high-voltage line L1, such that the heating unit 500 generates heat. In case that the pulse width is low, the switching unit 300 is turned off and cuts off the supply of electric power to the heating unit 500, such that the heat generation of the heating unit 500 is stopped. With the above-mentioned process, a temperature of the heating unit 500 is adjusted, such that air, which has exchanged heat with the heating unit 500, is supplied into the vehicle interior.

In this case, the high-voltage heater 1000 of the present invention is characterized by including a disconnection detection unit 600 configured to detect whether the heating unit 500 is disconnected in the state in which the high-voltage heater 1000 does not operate, i.e., in the state in which the pulse width modulation signal is not transmitted from the control unit 200 to the switching unit 300. Even in the state in which the high-voltage heater 1000 does not operate, the disconnection detection unit 600 may detect the disconnection of the heating unit 500, which makes it possible to quickly recognize whether the disconnection occurs. Therefore, it is possible to prevent burnout of the heating unit 500 or damage to a circuit of the high-voltage heater 1000 that occurs when the high-voltage heater 1000 operates in the state in which the heating unit 500 is disconnected.

Hereinafter, a detailed configuration of the disconnection detection unit 600 will be described in detail with reference to the drawings.

The high-voltage heater 1000 may include: a detection line L4 having one end connected between the switching unit 300 and the heating unit 500 on the high-voltage line L1, and the other end connected to the control unit 200 to transmit the high voltage, which is applied to the high-voltage line L1, to the control unit 200; and the disconnection detection unit 600 including a detection circuit 610 configured to decrease the high voltage to an allowable voltage of the control unit 200.

Therefore, in the state in which the pulse width modulation signal is not transmitted from the control unit 200 to the switching unit 300, the high voltage applied to the high-voltage line L1 may be transmitted to the control unit 200 through the heating unit 500 and the disconnection detection unit 600. In this case, when the heating unit 500 is normal, the high voltage is decreased by the detection circuit 610 and transmitted to the control unit 200. Therefore, the voltage, in this case, is defined as a reference voltage, and the reference voltage may be used to determine whether the heating unit

500 is disconnected. That is, in case that the heating unit 500 is disconnected, the high voltage applied to the high-voltage line L1 is not transmitted to the control unit 200 through the detection circuit 610. Therefore, the control unit 200 may determine that the heating unit 500 is disconnected in case that a detected voltage detected by the control unit 200 through the detection line L4 is lower than 0 or the reference voltage. Although not illustrated in the drawings, in another embodiment, the disconnection detection unit may include a DC voltage sensor. In this case, the DC voltage sensor may detect the high voltage applied to the high-voltage line L1, and a signal related to whether the high voltage is detected may be transmitted to the control unit 200.

Meanwhile, in case that it is determined that the heating unit 500 is disconnected, the control unit 200 blocks the pulse width modulation signal even though the input signal is received, which makes it possible to prevent a problem that may occur when the heater operates in case that the heating unit 500 is disconnected. In this case, the control unit 200 is configured to preferentially detect whether the high voltage is applied to the high-voltage line L1 by using the high-voltage detection unit 600 and then determine whether the heating unit 500 is disconnected. This is because the detected voltage, which is detected by the control unit 200 through the detection line L4 in case that the high voltage is not applied to the high-voltage line L1, is maintained to be 0 regardless of whether the heating unit 500 is disconnected.

In addition, the control unit 200 may be configured to determine whether the heating unit 500 is disconnected when the switching unit 300 is turned off even though the pulse width modulation signal is transmitted to the switching unit 300. That is, in case that the pulse width modulation signal is low, the switching unit 300 is turned off, and the voltage is not supplied to the heating unit 500. Therefore, the control unit 200 may determine whether the heating unit 500 is disconnected by using the disconnection detection unit 600 in the same way as the above-mentioned method.

That is, the control unit 200 may be configured to determine whether the heating unit 500 is disconnected by using the disconnection detection unit 600 in case that the pulse width modulation signal is low.

However, in case that the pulse width modulation signal is high, the switching unit 300 is turned on, and the high voltage is applied to the heating unit 500. For this reason, the voltage is not applied to the detection line L4 regardless of whether the heating unit 500 is disconnected, and the control unit 200 cannot recognize whether the heating unit 500 is disconnected by using the disconnection detection unit 600. Therefore, the high-voltage heater may include an electric current detection unit 700 to recognize whether the heating unit 500 is disconnected in case that the pulse width modulation signal is high. The electric current detection unit 700 includes: an electric current sensing resistor 710 provided between the switching unit 300 and the ground G1; and an electric current sensing line L5 configured to transmit an electric current, which is applied between the switching unit 300 and the electric current sensing resistor 710, to the control unit 200. Therefore, it may be determined that the heating unit 500 is disconnected in case that a detected electric current, which is transmitted to the control unit 200 through the electric current sensing line L5, is lower than a reference current value that may be transmitted to the control unit 200 in the state in which the heating unit 500 is normal. The electric current detection unit 700 may further include an amplifier 720 provided on the electric current sensing line L5 to amplify the detected electric current.

Figure 3:
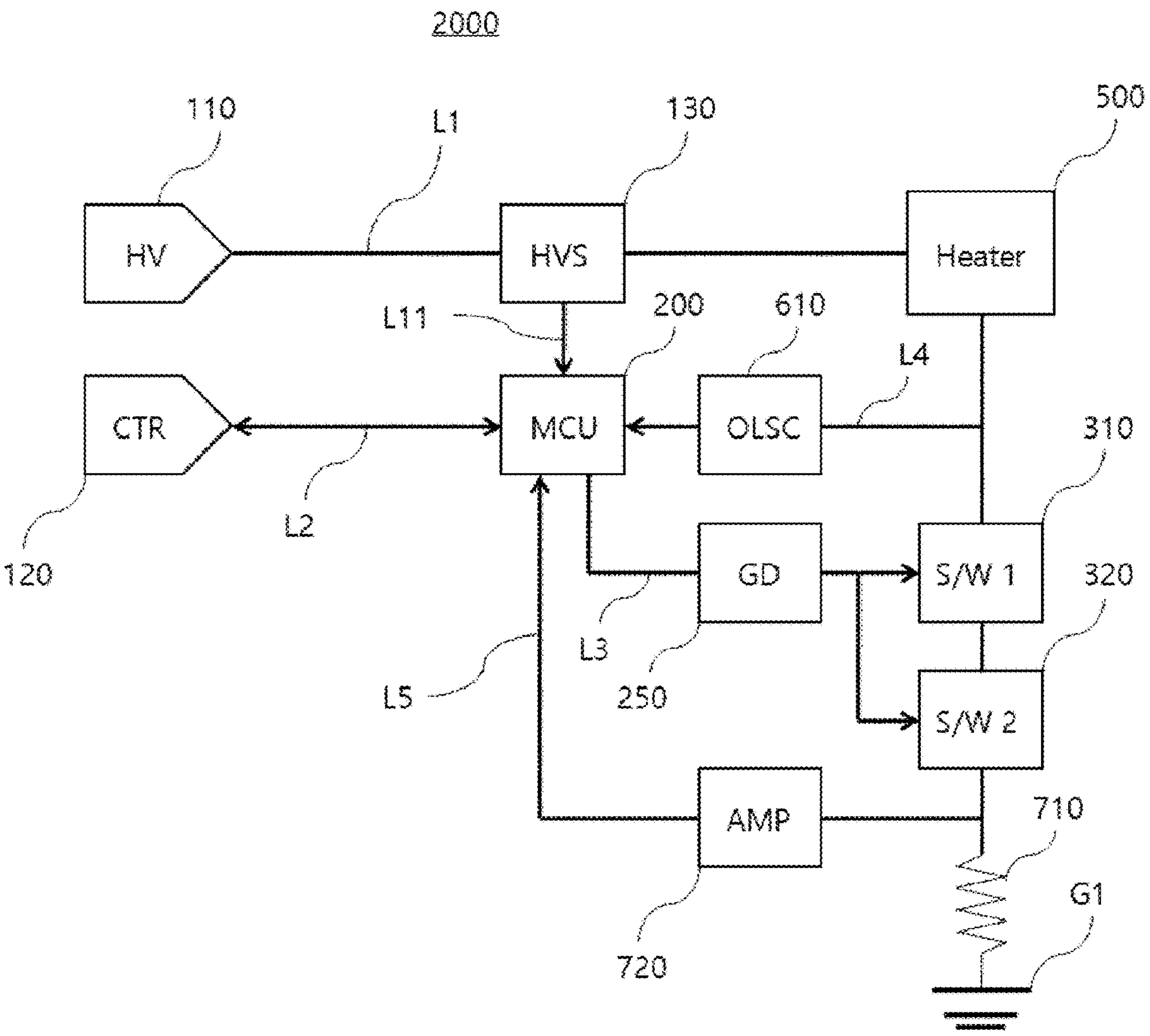
FIG. 3 is a circuit diagram illustrating a schematic configuration of a disconnection detection device of a high-voltage heater according to a second embodiment of the present invention.

FIG. 3 is a circuit diagram illustrating a schematic configuration of a high-voltage heater 2000 including a disconnection detection unit according to a second embodiment of the present invention.

As illustrated, the high-voltage heater 2000 includes: the high-voltage line L1 having one end connected to the high-voltage supply unit 110, and the other end connected to the ground G1; the control unit 200 configured to control switching units 310 and 320 in response to a control signal of the input unit 120; the switching units 310 and 320 provided on the high-voltage line L1 and configured to supply electric power to the heating unit 500 by being switched in response to a switching signal of the control unit 200; and the heating unit 500 provided between the switching units 310 and 320 and the high-voltage supply unit 100 on the high-voltage line L1 and configured to generate heat under the control of the switching units 310 and 320.

The high-voltage heater 2000 according to the second embodiment of the present invention is mostly identical in configuration to the high-voltage heater 1000 of the first embodiment, but the high-voltage heater 2000 differs from the high-voltage heater 1000 in that the high-voltage heater 2000 includes the plurality of switching units 310 and 320. Because the switching units 310 and 320 are restricted in terms of an allowable value of electric current consumption, the plurality of switching units 310 and 320 may be used by being connected in series on the high-voltage line L1 depending on a maximum output load of the heating unit 500.

Therefore, the control unit 200 may be configured to determine whether the heating unit 500 is disconnected when at least one of the plurality of switching units 310 and 320 is turned off even though the pulse width modulation signal is transmitted to the plurality of switching units 310 and 320. That is, in case that the pulse width modulation signal is low, the switching units 310 and 320 are turned off, and the voltage is not supplied to the heating unit 500. Therefore, the control unit 200 may determine whether the heating unit 500 is disconnected by using the disconnection detection unit 600 in the same way as the above-mentioned method.

Figure 4:
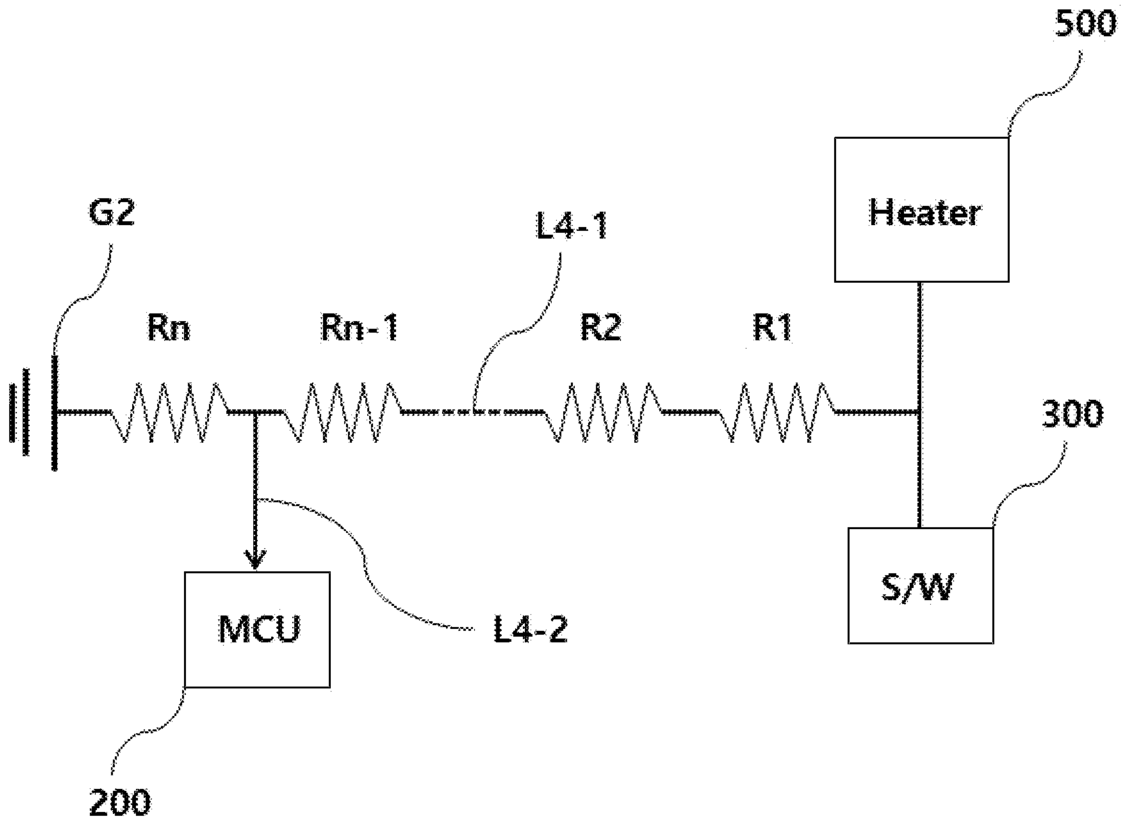
FIG. 4 is a schematic view of a disconnection detection unit according to the embodiment of the present invention.

FIG. 4 is a schematic view of the disconnection detection unit 600 according to the embodiment of the present invention. As illustrated, the disconnection detection unit 600 may include a first detection line L4-1 having one end connected between the switching unit 300 and the heating unit 500 on the high-voltage line L1, and the other end connected to the ground G2. A plurality of detection voltage resistors R1 to Rn may be connected in series on the first detection line L4 depending on a magnitude of the high voltage and an allowable voltage of the control unit 200. In addition, the disconnection detection unit 600 includes a second detection line L4-2 having one end connected between the nth resistor Rn and the (n−1)th resistor Rn−1 on the first detection line L4, and the other end connected to the control unit 200. The high voltage applied to the high-voltage line L1 may be decreased by the plurality of resistors provided on the first detection line L4-1 and transmitted to the control unit 200 through the second detection line L4-2.

Hereinafter, a disconnection detection method using the high-voltage heater 1000 including the disconnection detection unit according to the present invention will be described in detail with reference to the drawings.

Figure 5:
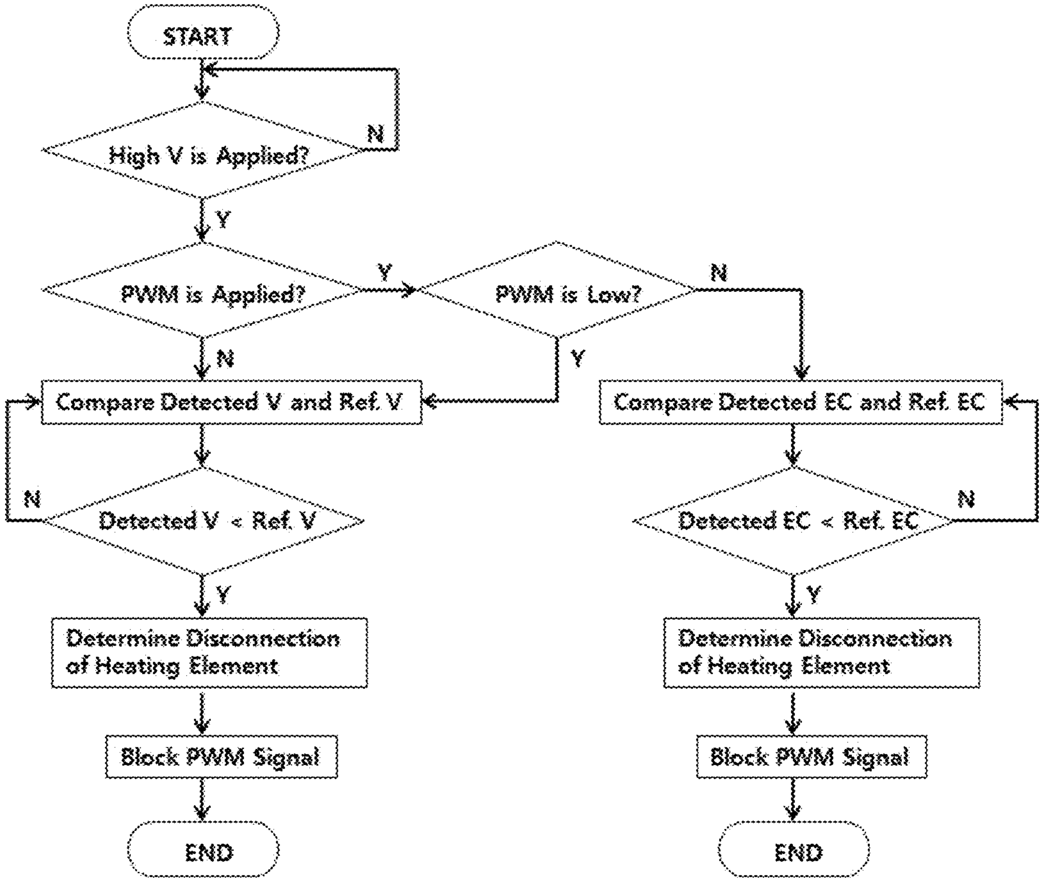
FIG. 5 is a flowchart illustrating a disconnection detection method of the high-voltage heater according to the embodiment of the present invention.

FIG. 5 is a flowchart illustrating the disconnection detection method of the high-voltage heater according to the embodiment of the present invention.

First, the disconnection detection method of the high-voltage heater according to the embodiment of the present invention performs a step of detecting whether the high voltage is applied to the high-voltage line L1 by using the high-voltage detection unit 130 provided on the high-voltage line L1. In case that the high voltage is not applied, whether the high voltage is applied is repeatedly detected until the high voltage is applied. In case that the high voltage is applied, the next step is performed.

Next, the disconnection detection method performs a step of detecting whether the pulse width modulation signal is applied to the signal line L2 by using the control unit 200. The case in which the pulse width modulation signal is applied will be described below. In case that the pulse width modulation signal is not applied, the next step is performed.

Next, the disconnection detection method performs a step of comparing the detected voltage detected by the disconnection detection unit 600 with the reference voltage that may be detected by the disconnection detection unit 600 when the heating unit 500 is normal. In this case, it is determined that the heating unit 500 is disconnected in case that the detected voltage is lower than the reference voltage. It is determined that the heating unit 500 is normal in case that the detected voltage is equal to or higher than the reference voltage. The step of comparing the detected voltage and the reference voltage is repeatedly performed.

In case that it is determined that the heating unit 500 is disconnected, the control unit 200 restricts the heat generation of the heating unit 500 by blocking the pulse width modulation signal even though the heater driving signal is transmitted to the control unit 200 through the input unit 120.

The disconnection detection method performs a step of detecting whether the pulse width modulation signal is high or low in case that the pulse width modulation signal is applied to the signal line L2 through the control unit 200. In case that the pulse width modulation signal is low, the disconnection detection method performs a step of comparing the detected voltage detected by the disconnection detection unit 600 with the reference voltage that may be detected by the disconnection detection unit 600 when the heating unit 500 is normal. The following processes are identical to the above-mentioned steps.

In case that the pulse width modulation signal is high, the disconnection detection method performs a step of comparing, by the control unit 200, the detected electric current generated between the switching unit 300 and the ground G1 with the reference current that may be detected by the control unit 200 when the heating unit is normal. In this case, it is determined that the heating unit 500 is disconnected in case that the detected electric current is lower than the reference current. It is determined that the heating unit 500 is normal in case that the detected electric current is equal to or higher than the reference current. The step of comparing the detected electric current and the reference current is repeatedly performed.

In case that it is determined that the heating unit 500 is disconnected, the control unit 200 restricts the heat generation of the heating unit 500 by blocking the pulse width modulation signal even though the heater driving signal is transmitted to the control unit 200 through the input unit 120.

The technical spirit should not be construed as being limited to the embodiments of the present invention. Of course, the scope of application is diverse, and various modifications and implementations may be made by those skilled in the art without departing from the subject matter of the present invention claimed in the claims. Accordingly, these improvements and modifications will fall within the scope of the present invention as long as they are apparent to those skilled in the art.

The invention claimed is:

1. A high-voltage heater including a disconnection detection unit, the high-voltage heater comprising:

a high-voltage line having one end connected to a high-voltage supply unit, and the other end connected to ground;

a control unit configured to control a switching unit including a switching element in response to a control signal of an input unit;

the switching unit provided on the high-voltage line and configured to supply electric power to a heating unit by being switched in response to a switching signal of the control unit;

the heating unit provided between the switching unit and the high-voltage supply unit on the high-voltage line and configured to generate heat under the control of the switching unit;

the disconnection detection unit configured to detect a voltage between the switching unit and the heating unit on the high-voltage line and transmit the voltage to the control unit; and the disconnection detection unit comprising a high-voltage detection unit provided on the high-voltage line and configured to provide the control unit with a signal indicating whether the high voltage is applied to the high-voltage line, wherein the control unit determines that the heating unit is disconnected when the voltage detected by the disconnection detection unit is lower than a reference voltage when a high voltage is applied to the high-voltage line, and wherein the control unit determines whether the heating unit is disconnected only when the control unit receives, from the high-voltage detection unit, a signal indicating that the high voltage is applied to the high-voltage line.

2. The high-voltage heater of claim 1, wherein the control unit transmits the switching signal to the switching unit through a pulse width modulation signal, and wherein the control unit determines whether the heating unit is disconnected when the pulse width modulation signal is not applied or the pulse width modulation signal is low.

3. The high-voltage heater of claim 1, wherein the control unit determines whether the heating unit is disconnected only when the switching unit is turned off.

4. The high-voltage heater of claim 1, wherein the disconnection detection unit is provided in the form of a plurality of resistors connected in series, the disconnection detection unit has one end connected between the switching unit and the heating unit on the high-voltage line, and the other end connected to ground, and the disconnection detection unit transmits a voltage between an nth resistor and an (n−1)th resistor from one end to the control unit.

5. The high-voltage heater of claim 1, wherein the disconnection detection unit comprises a DC voltage sensor, the DC voltage sensor detects a high voltage applied between the switching unit and the heating unit on the high-voltage line, and the disconnection detection unit provides the control unit with a signal indicating whether the high voltage is detected.

6. The high-voltage heater of claim 3, wherein the switching unit is provided as a plurality of switching units connected in series, and wherein the control unit determines whether the heating unit is disconnected only when at least one of the switching units is turned off.

7. The high-voltage heater of claim 2, wherein the high-voltage heater further comprises:

an electric current sensing resistor provided between the ground and the switching unit on the high-voltage line; and an electric current sensing unit configured to provide the control unit with an electric current between the electric current sensing resistor and the switching unit on the high-voltage line, and wherein the control unit determines that the heating unit is disconnected in case that the electric current detected by the electric current sensing unit is lower than a reference current when the pulse width signal is high.

8. A disconnection detection method of the high-voltage heater according to claim 1, the disconnection detection method comprising:

determining, by a high-voltage detection unit, whether a high voltage is applied to the high-voltage line;

determining, by the control unit, whether a pulse width modulation signal is applied when the high voltage is applied to the high-voltage line;

comparing, by the control unit, a detected voltage detected by the disconnection detection unit with a reference voltage detected by the disconnection detection unit when the heating unit is normal when the pulse width modulation signal is not applied; and determining, by the control unit, that the heating unit is disconnected when the detected voltage is lower than the reference voltage.

9. The disconnection detection method of claim 8, comprising:

detecting, by the control unit, whether a pulse width transmitted to the switching unit is high or low when the pulse width modulation signal is applied, wherein the control unit determines whether the heating unit is disconnected when the pulse width is low.

10. The disconnection detection method of claim 9, further comprising:

detecting, by the control unit, an electric current generated between the switching unit and the ground when the pulse width is high;

comparing the detected electric current with a reference current detected between the switching unit and the ground when the heating unit is normal; and determining, by the control unit, that the heating unit is disconnected when the detected electric current is lower than the reference current value.

11. The disconnection detection method of claim 8, wherein the switching unit is provided as a plurality of switching units connected in series, and wherein the disconnection detection method comprises:

detecting, by the control unit, an on/off state of the switching unit; and determining, by the control unit, whether the heating unit is disconnected only when at least one of the switching unit is turned off.

* * * * *